(12) United States Patent
Nishimura et al.

(10) Patent No.: US 10,972,071 B2
(45) Date of Patent: Apr. 6, 2021

(54) RESONATOR DEVICE

(71) Applicant: Murata Manufacturing Co., Ltd., Nagaokakyo (JP)

(72) Inventors: Toshio Nishimura, Nagaokakyo (JP); Yuichi Goto, Nagaokakyo (JP); Kentaro Yoshii, Nagaokakyo (JP); Ville Kaajakari, Altadena, CA (US)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 827 days.

(21) Appl. No.: 15/690,570

(22) Filed: Aug. 30, 2017

(65) Prior Publication Data
US 2018/0048285 A1 Feb. 15, 2018

Related U.S. Application Data

(63) Continuation of application No. PCT/JP2016/054627, filed on Feb. 17, 2016.
(Continued)

(51) Int. Cl.
*H03H 9/13* (2006.01)
*H03H 9/05* (2006.01)
(Continued)

(52) U.S. Cl.
CPC ........... *H03H 9/13* (2013.01); *H01L 41/0471* (2013.01); *H01L 41/0475* (2013.01);
(Continued)

(58) Field of Classification Search
CPC ...... H03H 9/13; H03H 9/0595; H03H 9/1057; H03H 9/17; H01L 41/0471; H01L 41/0475
(Continued)

(56) References Cited

U.S. PATENT DOCUMENTS

| 7,436,272 B2 | 10/2008 | Fujii et al. |
| 7,800,282 B2 | 9/2010 | Ayazi et al. |

(Continued)

FOREIGN PATENT DOCUMENTS

| JP | 2005130341 A | 5/2005 |
| JP | 2011-223234 A | 1/2006 |

(Continued)

OTHER PUBLICATIONS

International Search Report issued in International Application No. PCT/JP2016/054627, dated May 10, 2016.
(Continued)

*Primary Examiner* — Derek J Rosenau
(74) *Attorney, Agent, or Firm* — Arent Fox LLP

(57) ABSTRACT

A resonator with stabilized resonant frequency that includes a lower electrode, a plurality of upper electrodes, and a piezoelectric film disposed between the lower electrode and the plurality of upper electrodes. Moreover, an upper lid having a first and second opposing surfaces is provided so that the first surface faces and seals a first surface of the resonator. In addition, a lower lid having a first and second opposing surfaces is provided so that the first surface faces and seals a second surface of the resonator. The resonator further includes a power terminal electrically connected to the upper electrodes and a ground terminal provided on the second surface of the upper lid. The lower electrode is electrically connected to the ground terminal by the upper lid.

14 Claims, 15 Drawing Sheets

Related U.S. Application Data

(60) Provisional application No. 62/140,510, filed on Mar. 31, 2015.

(51) Int. Cl.
*H03H 9/10* (2006.01)
*H03H 9/24* (2006.01)
*H03H 9/02* (2006.01)
*H03H 9/17* (2006.01)
*H01L 41/047* (2006.01)

(52) U.S. Cl.
CPC ...... *H03H 9/02275* (2013.01); *H03H 9/0595* (2013.01); *H03H 9/1057* (2013.01); *H03H 9/17* (2013.01); *H03H 9/2452* (2013.01)

(58) Field of Classification Search
USPC .......................................... 310/348
See application file for complete search history.

(56) References Cited

U.S. PATENT DOCUMENTS

| | | | |
|---|---|---|---|
| 7,888,843 | B2 | 2/2011 | Ayazi et al. |
| 8,242,663 | B2 | 8/2012 | Ayazi et al. |
| 2007/0096605 | A1 | 5/2007 | Fujii et al. |
| 2008/0079515 | A1 | 4/2008 | Ayazi et al. |
| 2009/0072663 | A1 | 3/2009 | Ayazi et al. |
| 2009/0167116 | A1* | 7/2009 | Miyashita ............ H03H 9/0514 310/348 |
| 2010/0060111 | A1 | 3/2010 | Ayazi et al. |
| 2011/0133848 | A1 | 6/2011 | Ayazi et al. |
| 2012/0280594 | A1 | 11/2012 | Chen et al. |
| 2012/0293520 | A1 | 11/2012 | Yun et al. |
| 2013/0140944 | A1* | 6/2013 | Chen ...................... H02N 1/006 310/300 |

FOREIGN PATENT DOCUMENTS

JP 2010-539852 A 12/2010
WO WO 2006/001125 A1 1/2006

OTHER PUBLICATIONS

Written Opinion of the International Searching Authority issued in International Application No. PCT/JP2016/054627, dated May 10, 2016.

* cited by examiner

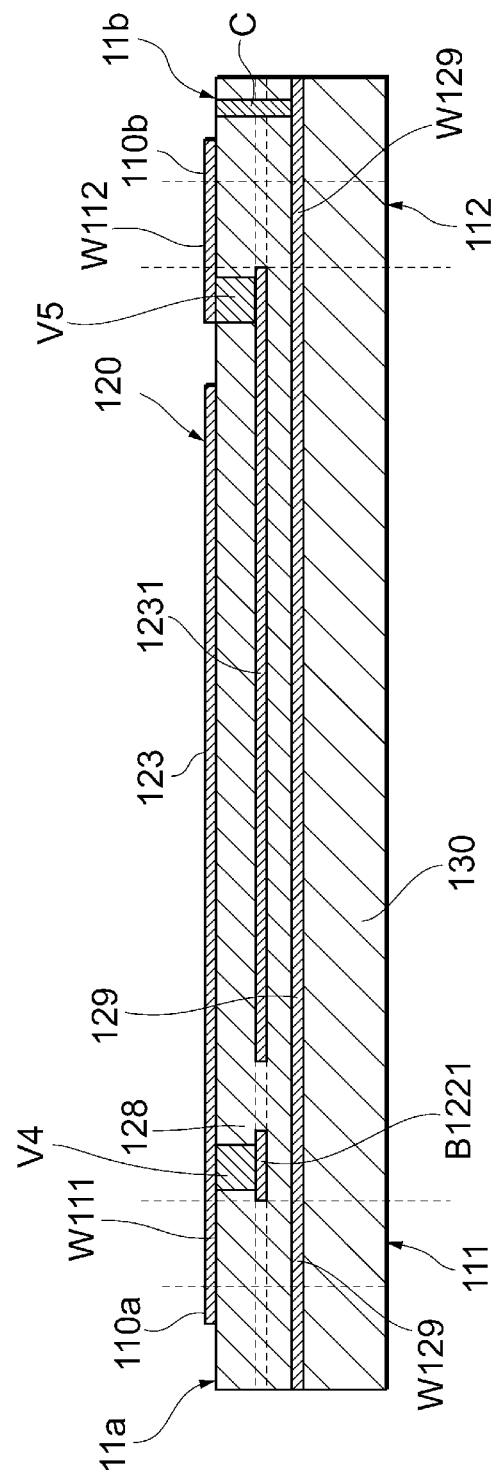

RESONATOR DEVICE

CROSS REFERENCE TO RELATED APPLICATIONS

The present application is a continuation of PCT/JP2016/054627 filed Feb. 17, 2016, which claims priority to U.S. Patent Provisional No. 62/140,510, filed Mar. 31, 2015, the entire contents of each of which are incorporated herein by reference.

TECHNICAL FIELD

The present disclosure relates to a resonator device.

BACKGROUND

Currently, piezoelectric resonator devices using MEMS (Micro Electro Mechanical Systems) technology can be used, for example, as timing devices. Typically, these piezoelectric resonator devices are mounted on a printed circuit board built in an electronic apparatus such as a smartphone.

Resonators used in such piezoelectric resonator devices include a resonator that provides contour vibration with harmonic in which a piezoelectric film is formed on a lower electrode and a plurality of upper electrodes are formed to cover the piezoelectric film. Patent Document 1 (identified below) discloses a configuration of a resonator in which two upper electrodes are respectively connected to an input terminal and an output terminal, and a lower electrode is floating.

Patent Document 1: U.S. Patent Application Publication No. 2012/0293520.

Using the technology disclosed in Patent Document 1, if another electric potential is present around the lower electrode, the electric potential may affect the lower electrode. As the result, the resonant frequency of the resonator may vary.

SUMMARY

The present disclosure is provided in the light of such situations. It is an object of the disclosure to provide a resonator device that can stabilize resonant frequency.

Accordingly, a resonator device according to an exemplary aspect is disclosed that includes a resonator including a lower electrode, a plurality of upper electrodes, and a piezoelectric film formed between the lower electrode and the plurality of upper electrodes. Moreover, the resonator device includes an upper lid having a first surface and a second surface with the first surface facing the upper electrodes of the resonator and sealing a first surface of the resonator. In addition, a lower lid is provided that has a first surface and a second surface with the first surface facing the lower electrode of the resonator and sealing a second surface of the resonator. Moreover, a power terminal is electrically connected to the upper electrodes, and a ground terminal is provided on the second surface of the upper lid. The lower electrode is electrically connected to the ground terminal via the upper lid.

With the exemplary resonator device, the influence of another electric potential present around the lower electrode on the lower electrode can be reduced, which, in turn, enables the resonant frequency to be increased.

Preferably, the resonator device may further include a first through hole formed in the upper lid; a wire that connects the power terminal with the upper electrodes via the first through hole; and an insulating layer provided between the upper lid and the first through hole. The upper lid may be electrically connected to the ground terminal and the lower electrode. Furthermore, a capacitance may be formed between the upper lid and the power terminal with the insulating layer interposed therebetween.

With this design, the electric charge is formed between the upper lid and the power terminal. Accordingly, the formed electric charge can be stored and used as a capacitance for an oscillation circuit.

Preferably, the upper lid may be formed of degenerate silicon according to an exemplary aspect.

With this design, the upper lid has conductivity. Since the ground terminal is provided on the upper lid and hence the upper lid is grounded, parasitic capacitance which is generated around the power terminal formed on the upper lid can be reduced. Accordingly, resonant characteristics can be improved.

Preferably, the resonator device may further include a junction layer that joins the upper lid to the resonator. The lower electrode may be electrically connected to the ground terminal via the junction layer.

With this design, the lower electrode can be electrically connected to the ground terminal by using the junction layer. Accordingly, the size of the resonator device can be decreased.

Preferably, the resonator device may further include a second through hole formed in the upper lid; and a wire provided at the second through hole. The lower electrode may be electrically connected to the ground terminal via the wire in the second through hole.

With this design, the lower electrode is connected to the ground terminal via the wire provided in the through hole of the upper lid. Accordingly, reliability of conduction between the lower electrode and the ground terminal can be improved.

According to the exemplary embodiments, the resonant frequency of the disclosed resonator can be stabilized.

BRIEF DESCRIPTION OF DRAWINGS

FIG. 14 schematically illustrates an example structure in a cross section of the resonator according to the sixth embodiment.

DETAILED DESCRIPTION OF EXEMPLARY EMBODIMENTS

First Embodiment

Figure 1:
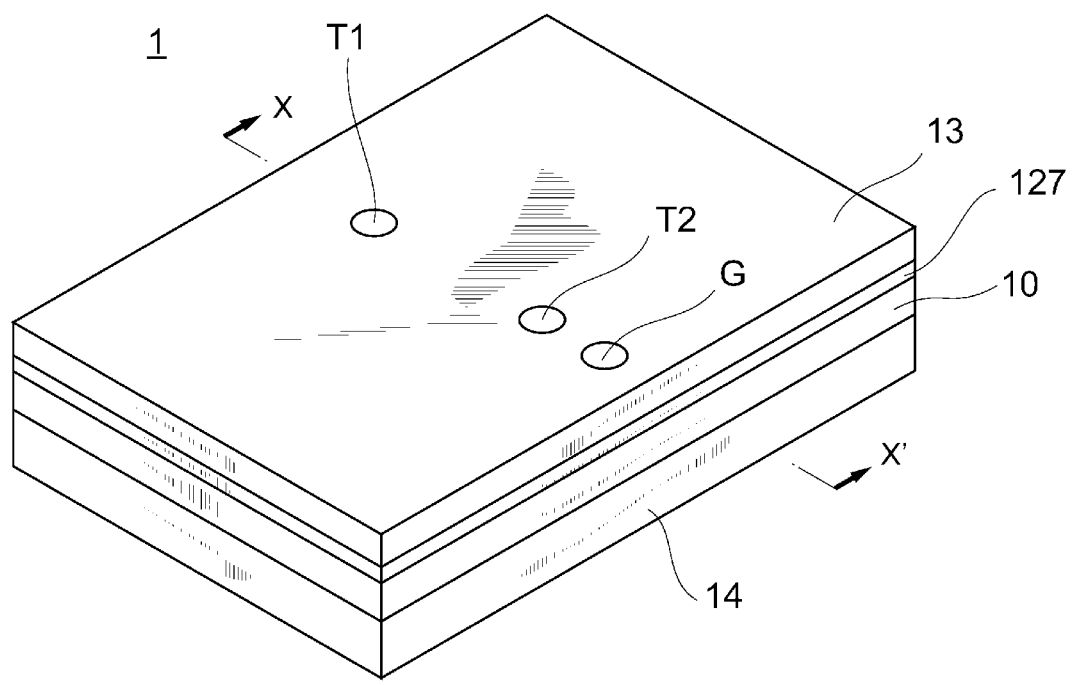
FIG. 1 is a perspective view schematically illustrating the external appearance of a resonator device according to a first embodiment.
Figure 2:
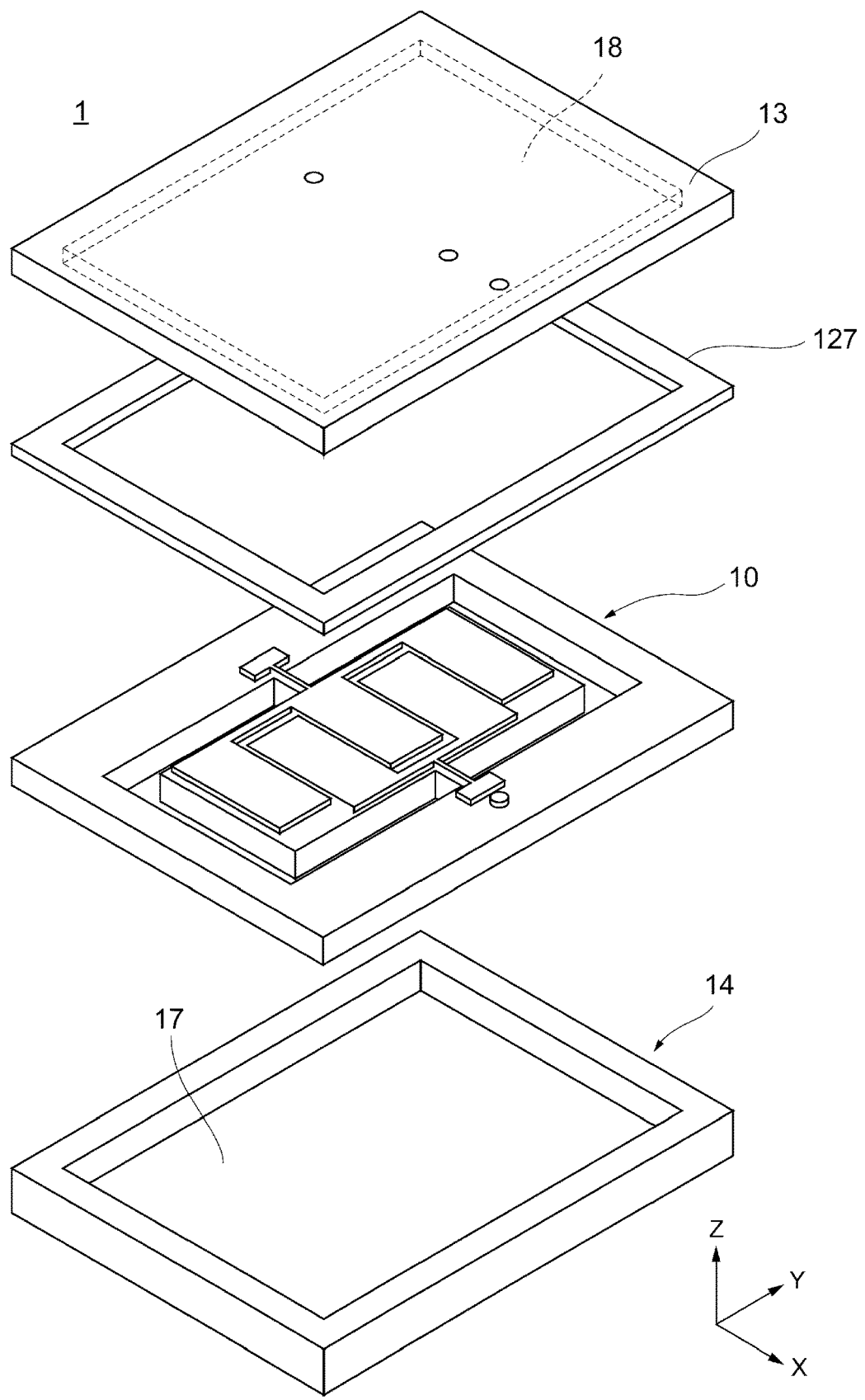
FIG. 2 is an exploded perspective view schematically illustrating the structure of the resonator device according to the first embodiment.
Figure 3:
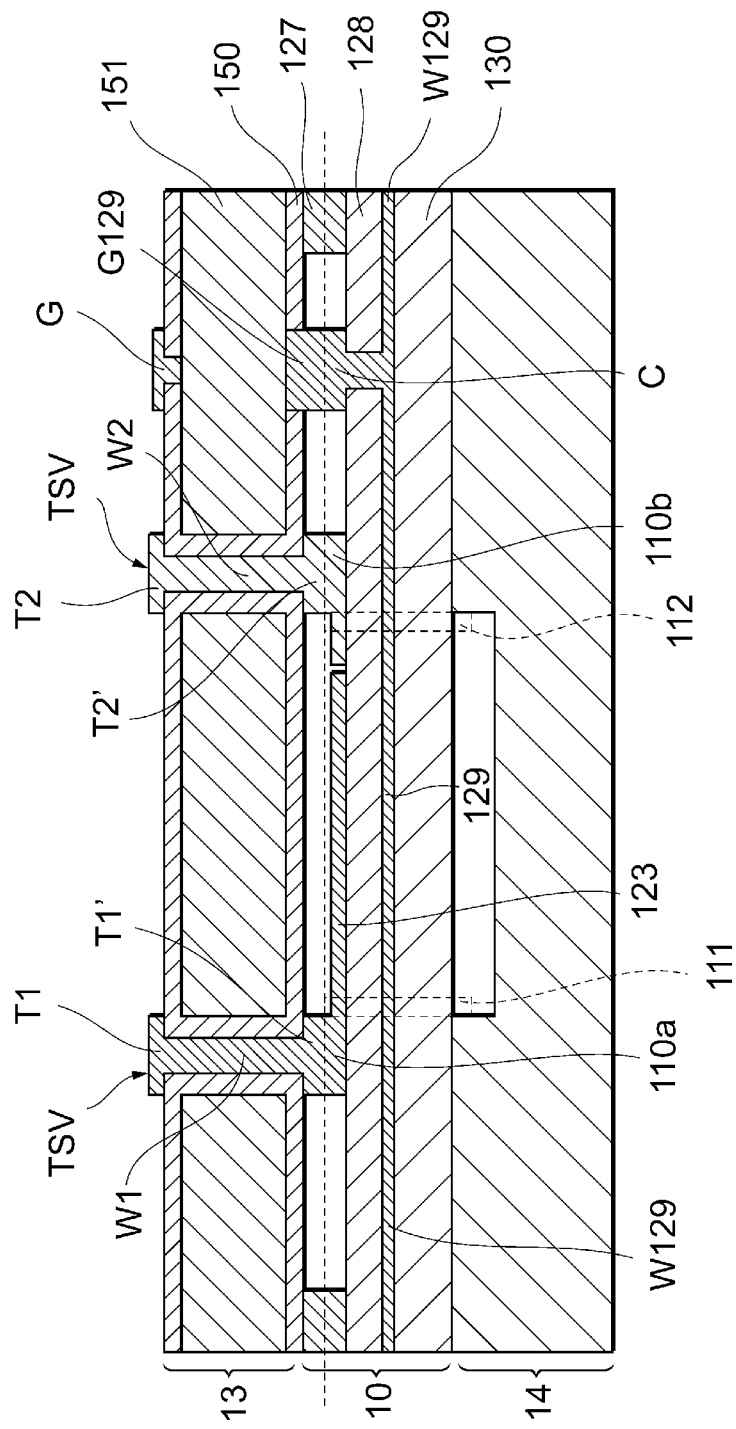
FIG. 3 schematically illustrates an example structure in a cross section of the resonator device according to the first embodiment.

A first exemplary embodiment is described below with reference to the accompanying drawings. FIG. 1 is a perspective view schematically illustrating the external appearance of a resonator device 1 according to the first exemplary embodiment. FIG. 2 is an exploded perspective view schematically illustrating the structure of the resonator device 1 according to the first exemplary embodiment. FIG. 3 is a cross-sectional view taken along line X-X' in FIG. 1.

The resonator device 1 includes a resonator 10, and an upper lid 13 and a lower lid 14 that sandwich and seal the resonator 10 and form a vibration space in which the resonator 10 vibrates. In the resonator device 1, the lower lid 14, the resonator 10, a junction portion 127 (i.e., an example of a junction layer), and the upper lid 13 are stacked in that order and joined to one another.

According to the exemplary embodiments, the resonator 10 is a MEMS vibrator manufactured by using MEMS technology.

According to an exemplary aspect, the resonator 10 and the upper lid 13 are joined with the junction portion 127 arranged therebetween. Hence the vibration space of the resonator 10 is formed and the resonator 10 is sealed. The resonator 10 and the lower lid 14 are formed by using Si substrates. The Si substrates are joined to one another and the vibration space of the resonator 10 is formed. The resonator 10 and the lower lid 14 may be formed by using SOI substrates.

Components of the resonator device 1 are described below in detail. In the following description, the side of the resonator device 1 provided with the upper lid 13 is named front side, and the side provided with the lower lid 14 is named rear side.

(1. Lower Lid 14)

FIG. 2 is an exploded perspective view schematically illustrating the structure of the resonator device 1 according to the first exemplary embodiment. The lower lid 14 extends in a flat-plate shape along the XY plane. A recess 17 having, for example, a flat rectangular-parallelepiped shape is formed in the front surface of the lower lid 14 (an example of a first surface of a lower lid). The recess 17 forms a portion of the vibration space of the resonator 10. The lower lid 14 is formed of, for example, silicon (Si).

(2. Resonator 10)

Figure 4:
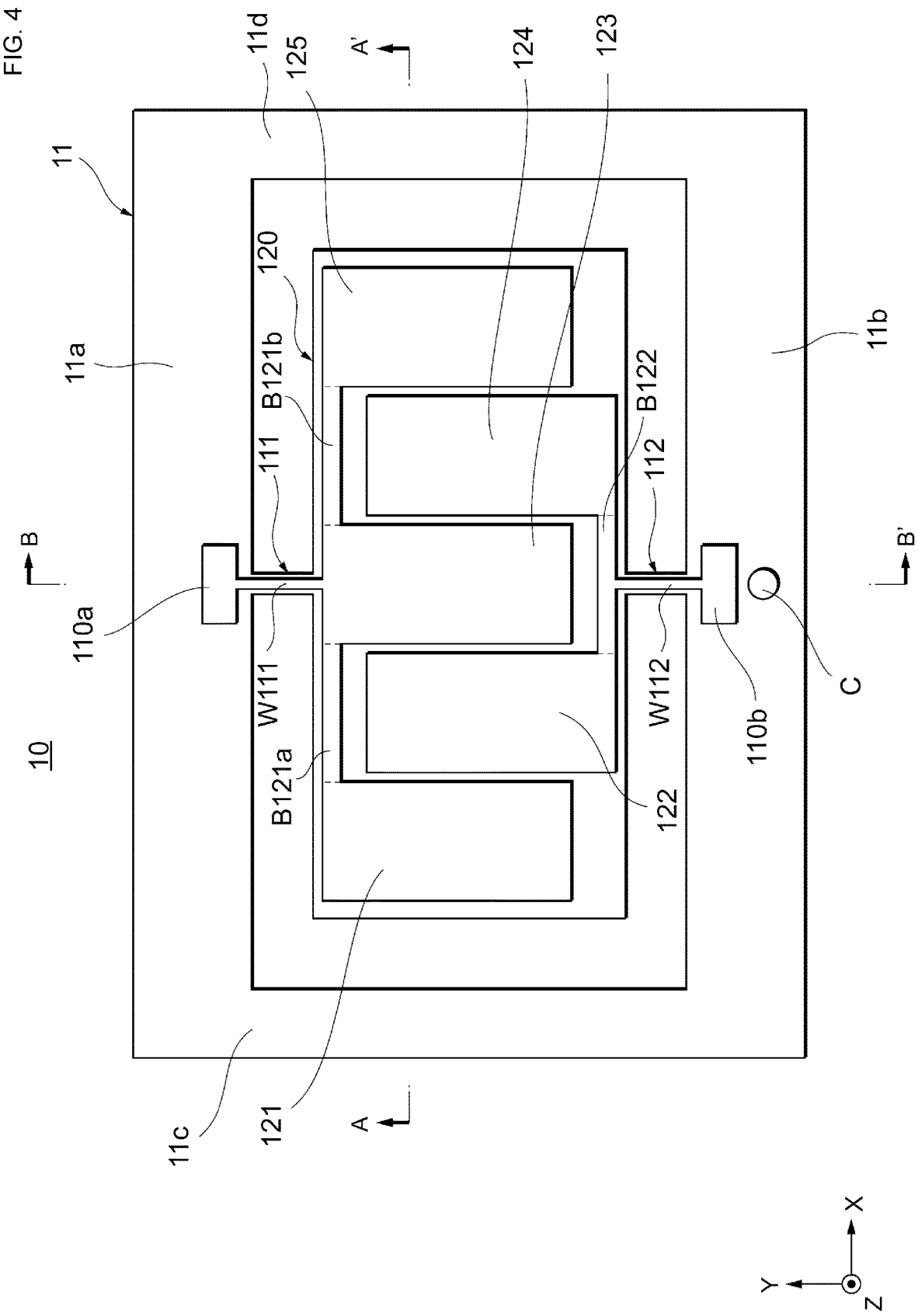
FIG. 4 is a plan view schematically illustrating an example structure of a resonator according to the first embodiment.

FIG. 4 is a plan view schematically illustrating the structure of the resonator 10 according to this embodiment. Components of the resonator 10 according to this embodiment are described with reference to FIG. 4. The front surface of the resonator 10 (an example of a first surface of a resonator) is sealed by the upper lid 13. The rear surface (an example of a second surface of the resonator) is sealed by the lower lid 14. The resonator 10 includes a vibrating portion 120, a holder 11, and holding arms 111 and 112.

(2-1. Configuration of Resonator 10)

(a) Vibrating Portion 120

According to an exemplary aspect, the vibrating portion 120 has a substantially rectangular-parallelepiped contour extending in a flat-plate shape along the XY plane according to the orthogonal coordinate system in FIG. 4. Five rectangular-plate-shaped upper electrodes 121 to 125 each having a length direction and a width direction are provided on the vibrating portion 120. In FIG. 4, the vibrating portion 120 has long sides in the X-axis direction and short sides in the Y-axis direction. The five upper electrodes 121 to 125 have long sides in the Y-axis direction and short sides in the X-axis direction.

As shown, the upper electrode 121 is connected to the upper electrode 123 by a busbar B121a. The busbar B121a is provided at an end portion on a frame body 11a side of the vibrating portion 120 so as to face a short side (on the frame body 11a side) of the upper electrode 122. The busbar B121a is connected to an upper end (an end portion on the frame body 11a side) of a long side of the upper electrode 121 facing the upper electrode 122, and to an upper end (an end portion on the frame body 11a side) of a long side of the upper electrode 123 facing the upper electrode 122.

Similarly, the upper electrode 123 is connected to the upper electrode 125 by a busbar B121b. The busbar B121b is provided at an end portion on the frame body 11a side of the vibrating portion 120 so as to face a short side (on the frame body 11a side) of the upper electrode 124. The busbar B121b is connected to an upper end (an end portion on the frame body 11a side) of a long side of the upper electrode 123 facing the upper electrode 124, and to an upper end (an end portion on the frame body 11a side) of a long side of the upper electrode 125 facing the upper electrode 124.

Moreover, the upper electrodes 122 and 124 are connected by a busbar B122. As shown, the busbar B122 is provided at an end portion on a frame body 11b side of the vibrating portion 120 so as to face a short side (on the frame body 11b side) of the upper electrode 123. The busbar B122 is connected to a lower end (an end portion on the frame body 11b side) of a long side of the upper electrode 122 facing the upper electrode 123, and to a lower end (an end portion on the frame body 11b side) of a long side of the upper electrode 124 facing the upper electrode 123.

A space is formed between the vibrating portion 120 and the holder 11 by a predetermined distance. In the example in FIG. 4, the vibrating portion 120 is connected to and held by the holder 11 by using the holding arms 111 and 112 (described below) at a pair of long sides of the vibrating portion 120. On the other hand, the vibrating portion 120 is not held by the holder 11 at a pair of short sides of the vibrating portion 120.

Figure 5A:
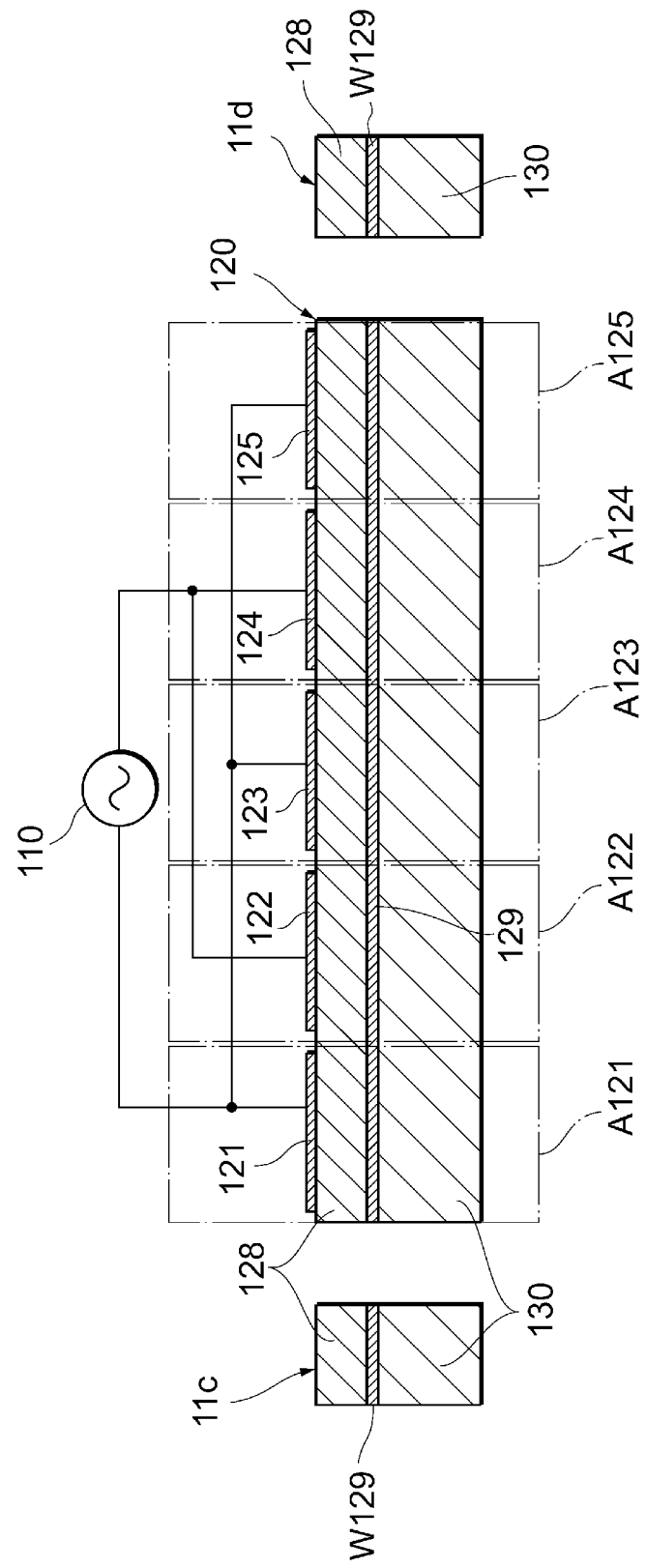
FIG. 5A schematically illustrates an example structure in a cross section of the resonator according to the first embodiment.

The stack structure of the vibrating portion 120 is described with reference to FIG. 5A. FIG. 5A is a cross-sectional view taken along line A-A' in FIG. 4.

As illustrated in FIG. 5A, in the vibrating portion 120, a lower electrode 129 is stacked on a Si substrate 130 made of a degenerate semiconductor. The Si substrate 130 may desirably have, for example, a length of about 140 µm, a width of about 400 µm, and a thickness of about 10 µm. The lower electrode 129 is formed of metal, for example, molybdenum (Mo) or aluminum (Al), and has a thickness of about 0.1 µm. Alternatively, the Si substrate 130 being a degenerate semiconductor may be used as a lower electrode without formation of the lower electrode 129.

Moreover, a piezoelectric thin film 128 (an example of a piezoelectric film) is stacked on the lower electrode 129 so as to cover the lower electrode 129. Further, the upper electrodes 121 to 125 are stacked on the piezoelectric thin film 128. The upper electrodes 121 to 125 are formed on the vibrating portion 120, and then divided into five separate electrodes 121 to 125 by processing such as etching, for example.

The piezoelectric thin film 128 is a thin film of a piezoelectric substance that transforms an applied voltage into a vibration. For example, the main component of the piezoelectric substance may be a nitride such as aluminum nitride, or an oxide. To be specific, the piezoelectric thin film 128 may be formed of scandium aluminum nitride (ScAlN). ScAlN is obtained by replacing part of aluminum (Al) in aluminum nitride (AlN) with scandium (Sc). Also, the piezoelectric thin film 128 has, for example, a thickness of 0.8 µm.

Also, the upper electrodes 121 to 125 are formed of metal, for example, molybdenum (Mo) or aluminum (Al), and each have a thickness of about 0.1 µm similarly to the lower electrode 129.

Si oxide films may be formed on upper and lower surfaces of the Si substrate 130 or upper and lower surfaces of the piezoelectric thin film 128. Accordingly, an advantageous effect of improving frequency temperature characteristics of the resonator 10 is obtained.

Next, a function of the vibrating portion 120 is described. The vibrating portion 120 provides contour vibration in the X-axis direction when an alternating electric field is applied to the vibrating portion 120. In particular, the piezoelectric thin film 128 is oriented in a c-axis direction. Thus, when a predetermined electric field is applied to the upper electrodes 121 to 125 to form a predetermined electric potential difference between the lower electrode 129 and the upper electrodes 121 to 125, the piezoelectric thin film 128 expands and contracts in the XY plane direction in accordance with the electric potential difference. Thus the vibrating portion 120 provides contour vibration.

As illustrated in FIG. 5A, the vibrating portion 120 is divided into vibration regions A121 to A125 corresponding to the upper electrodes 121 to 125. That is, the upper electrodes 121 to 125 are respectively formed in the vibration regions A121 to A125. When an alternating electric field is applied in the c-axis direction of the piezoelectric thin film 128 so that neighboring electrodes have opposite phases in the upper electrodes 121 to 125, neighboring ones of the vibration regions A121 to A125 are mechanically coupled to one another. Accordingly, a portion around the center in the X-axis direction of each region serves as a node of vibration. The five vibration regions A121 to A125 vibrate in the in-plane direction because the neighboring regions have the opposite phases. Thus the vibrating portion 120 provides contour vibration as a whole. As shown, the Si substrate 130, the lower electrode 129, and the piezoelectric thin film 128 are shared by the vibration regions A121 to A125. Also, the vibration mode of the vibrating portion 120 may be any of out-of-plane bending vibration, in-plane bending vibration, and contour vibration.

Referring back to FIG. 4, other components of the resonator 10 are described.

(b) Holder 11

The holder 11 is formed in a rectangular frame shape along the XY plane. The holder 11 is only required to be provided at least at a portion of the periphery of the vibrating portion 120. The shape of the holder 11 is not limited to the frame shape.

The holder 11 is provided to surround the vibrating portion 120 and the outer side portion of the vibrating portion 120 along the XY plane. In particular, the holder 11 includes a pair of long-side plate-shaped frame bodies 11a and 11b extending in parallel to the X-axis direction so as to face the long sides of the vibrating portion 120, and a pair of short-side frame bodies 11c and 11d extending in parallel to the Y-axis direction so as to face the short sides of the vibrating portion 120. Both ends of the frame bodies 11c and 11d are respectively connected to both ends of the frame bodies 11a and 11b.

Voltage applying portions 110a and 110b are respectively formed on the frame bodies 11a and 11b. The voltage applying portions 110a and 110b can apply alternating electric fields to the upper electrodes 121 to 125 via upper wires W111 and W112. In this embodiment, the voltage applying portion 110a is formed around the center of the frame body 11a, and the voltage applying portion 110b is formed around the center of the frame body 11b.

As illustrated in FIG. 5A, in the holder 11, the lower wire W129 is formed on the Si substrate 130 made of a degenerate semiconductor, and the piezoelectric thin film 128 is stacked on a lower wire W129 to cover the lower wire W129. In the holder 11 in which the Si substrate 130, the lower wire W129, the piezoelectric thin film 128, and the upper wires W111 and W112 are stacked in that order is integrally formed with the vibrating portion 120 in which the Si substrate 130, the lower electrode 129, the piezoelectric thin film 128, and the upper electrode 121 are stacked in that order, by the same process. Then, the upper electrodes 121 to 125 are removed by processing such as etching so as to obtain a desirable shape. The lower wire W129 provided in the holder 11 may be removed when the lower electrode 129 is formed into a predetermined shape by etching etc.

Further, as illustrated in FIG. 3, a portion of the piezoelectric thin film 128 formed on the frame body 11b is removed by processing such as etching so that the lower wire W129 is exposed, and a via is formed in the holder 11. The via (that is, the portion from which the piezoelectric thin film 128 is removed) is filled with a conductive material, for example, molybdenum or aluminum, and hence a conductive layer C is formed. The conductive layer C serves as a connection point between a ground wire G129 (described later) and the lower electrode 129.

Referring back to FIG. 4, other components of the vibrating portion 120 are described.

(c) Holding Arms 111 and 112

The holding arm 111 is provided inside the holder 11, and connects the long side of the vibrating portion 120 with the frame body 11a. The upper wire W111 is provided on the front surface of the holding arm 111. The upper wire W111 causes the upper electrodes 121, 123, and 125 of the vibrating portion 120 to be continuously formed to the holding arm 111. In particular, the upper wire W111 is continuously integrally formed from the connection position between the vibrating portion 120 and the holding arm 111 to the connection position between the holding arm 111 and the frame body 11a.

The holding arm 112 is provided inside the holder 11, and connects the long side of the vibrating portion 120 with the frame body 11b. The upper wire W112 is provided on the front surface of the holding arm 112. The upper wire W112 causes the upper electrodes 122 and 124 of the vibrating portion 120 to be continuously formed to the holding arm 112. In particular, the upper wire W112 is continuously integrally formed from the connection position between the vibrating portion 120 and the holding arm 112 to the connection position between the holding arm 112 and the frame body 11b.

Figure 5B:
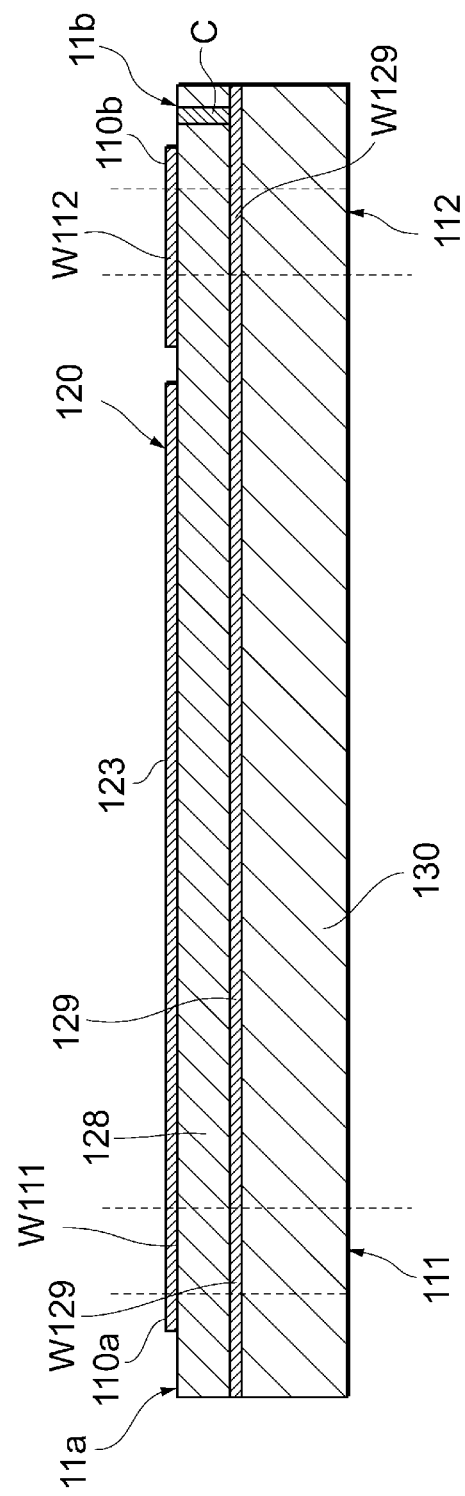
FIG. 5B schematically illustrates an example structure in a cross section of the resonator according to the first embodiment.

FIG. 5B is a cross-sectional view taken along line B-B' in FIG. 4. The stack structures of the holding arms 111 and 112 are described with reference to FIG. 5B. The broken lines in the figure indicate the boundaries among the holding arms 111 and 112, the vibrating portion 120, and the frame bodies 11a and 11b.

As illustrated in FIG. 5B, in the holding arms 111 and 112, the lower wire W129 is stacked on the Si substrate 130 made of a degenerate semiconductor. The lower wire W129 is integrally formed with the lower electrode 129 of the vibrating portion 120 by the same process. The lower electrode 129 and the lower wire W129 are continuously formed to extend from the vibrating portion 120 to the holding arms 111 and 112. The piezoelectric thin film 128 is stacked on the lower wire W129 so as to cover the lower wire W129.

Further, in the holding arm 111, the upper wire W111 is provided on the piezoelectric thin film 128. The upper wire W111 is integrally formed with the upper electrodes 121 to 125 of the vibrating portion 120 by the same process. The upper electrodes 121, 123, and 125, and the upper wire W111 are continuously formed to extend from the vibrating portion 120 to the holding arm 111. Further, in the holding arm 112, the upper wire W112 is provided on the piezoelectric thin film 128. The upper wire W112 is integrally formed with the upper electrodes 121 to 125 of the vibrating portion 120 by the same process. The upper electrodes 122 and 124, and the upper wire W112 are continuously formed to extend from the vibrating portion 120 to the holding arm 112.

The Si substrate 130, the lower wire W129, the piezoelectric thin film 128, and the upper wires W111 and W112 in the holding arms 111 and 112 are respectively simultaneously formed with the Si substrate 130, the lower electrode 129, the piezoelectric thin film 128, and the upper electrode 121 in the vibrating portion 120. The components are formed so as to properly have desirable shapes by processing such as etching if required. The lower wire W129 provided in the holding arms 111 and 112 may be removed when the lower electrode 129 is formed into a predetermined shape by etching etc.

Referring back to FIG. 1, other components of the resonator device 1 are described.

(3. Junction Portion 127)

The junction portion 127 is formed in a rectangular frame shape along the XY plane. The junction portion 127 is provided between the resonator 10 and the upper lid 13, joins the resonator 10 and the upper lid 13 in a eutectic manner, and seals the vibration space of the resonator 10. The junction portion 127 is formed by using metal, for example, aluminum (Al) or germanium (Ge).

(4. Upper Lid 13)

(4-1. Configuration of Upper Lid 13)

As illustrated in FIG. 1, the upper lid 13 extends in a flat-plate shape along the XY plane. A recess 18 having, for example, a flat rectangular-parallelepiped shape is formed in the rear surface of the upper lid 13. The recess 18 forms a portion of the vibration space of the resonator 10. This vibration space is maintained in a vacuum. The upper lid 13 has terminals T1, T2 (an example of a power source terminal), T1', and T2', a ground terminal G, wires W1 and W2, and a ground wire G129. The components of the upper lid 13 are described with reference to FIG. 3.

(a) Terminals T1, T2, T1', and T2'

The terminals T1 and T2 are formed on a front surface of the upper lid 13 (an example of a second surface of an upper lid). The terminals T1' and T2' are formed on a rear surface of the upper lid 13 (an example of a first surface of the upper lid), at positions opposite to the terminals T1 and T2. The terminals T1 and T1' are connected by the wire W1. The terminals T2 and T2' are connected by the wire W2. The terminals T1' and T2' are connected to the voltage applying portions 110a and 110b when the upper lid 13 and the resonator 10 are coupled by the junction portion 127 in a eutectic manner. Accordingly, voltages can be supplied from the terminals T1 and T2 to the voltage applying portions 110a and 110b.

(b) Wires W1 and W2

The wire W1 is provided in a through hole TSV (described later, an example of a first through hole), and connects the terminal T1 with the terminal T1'. The wire W2 is provided in a through hole TSV (described later), and connects the terminal T2 with the terminal T2'

(c) Ground Terminal G

The ground terminal G is electrically connected to the lower wiring W129 of the holder 11 via the ground wire G129, and grounds the lower electrode 129.

(d) Ground Wire G129

The ground wire G129 is electrically connected to the lower wire W129 in the conductive layer C formed on the resonator 10. The ground wire G129 is connected to the conductive layer C when the upper lid 13 and the resonator 10 are joined by the junction portion 127 in a eutectic manner.

(4-2. Cross-Section of Upper Lid 13)

As illustrated in FIG. 3, the upper lid 13 is configured, for example, by forming an insulating film 150 (an example of an insulating layer) made of silicon oxide (for example, SiO$_2$) on surfaces of a Si layer 151 made of a degenerate semiconductor. The insulating film 150 is formed on the surfaces of the Si layer 151, for example, by using oxidization of the surfaces of the Si layer 151 or chemical vapor deposition (CVD).

The upper lid 13 has the through holes TSV respectively formed at positions of the terminals T1 and T2. The wires W1 and W2 are formed in the through holes TSV. The insulating film 150 is formed on the surfaces of the Si layer 151, as well as on the inner sides of the through holes TSV. That is, the wires W1 and W2 are electrically insulated from the Si layer 151 by the insulating film 150.

The insulating film 150 is removed by processing such as etching from the upper lid 13 and hence the Si layer 151 is exposed at a position at which the ground terminal G is to be formed. Then, the ground terminal G is formed on the exposed Si layer 151. Accordingly, the Si layer 151 is directly connected to the ground terminal G, and the Si layer 151 of the upper lid 13 is entirely grounded via the ground terminal G. The ground terminal G is joined to the Si layer 151 by ohmic junction by forming metal, such as gold (Au) or aluminum (Al) on the Si layer 151 and thermally annealing the metal.

Further, the insulating film 150 is removed from the upper lid 13 by processing such as etching at a position at which the ground wire G129 is to be formed. The ground wire G129 is formed on the exposed Si layer 151. The ground wire G129 is joined to the Si layer 151 by ohmic junction by forming metal, such as gold (Au) or aluminum (Al) on the Si layer 151 and thermally annealing the metal. Accordingly, the ground terminal G is electrically connected to the ground wire G129 via the Si layer 151 of the upper lid 13. Further, by joining the ground wire G129 to the conductive layer C, the lower electrode 129 is electrically connected to the ground terminal G.

In this way, in the resonator device 1 according to this exemplary embodiment, the lower electrode 129 of the resonator 10 is electrically connected to the ground terminal G via the upper lid 13. As such, the lower electrode 129 is grounded, and, therefore, the influence of another electric potential present around the lower electrode 129 (for example, an electric potential caused by the influence of a wire, another component, and a human) can be reduced. As the result, the resonant frequency can be stabilized compared with conventional designs as described above.

Also, since the upper lid 13 is formed of a degenerate semiconductor, the upper lid 13 has electrical conductivity. Hence, by providing the ground terminal G on the upper lid 13 and grounding the upper lid 13 and the lower electrode 129, the influence of parasitic capacitance generated around the terminals T1 and T2, or around the junction portion 127 can be reduced. Accordingly, resonant characteristics, such as the maximum phase and oscillation stability, of the resonator 10 can be improved.

Moreover, since the upper lid 13 is grounded by the ground terminal G, a capacitance is formed between the upper lid 13 and the terminals T1, T2 with the insulating film 150 interposed therebetween. As the result, the capacitance can serve as a capacitance of an oscillation circuit formed by using the resonator device 1.

Second Embodiment

In describing a second embodiment and additional embodiments below, it is noted that the description on the elements common to the first embodiment is omitted, and only different aspects of the different embodiments are described. In particular, similar advantageous effects obtained by similar configurations are not repeated in respective embodiments.

Figure 6:
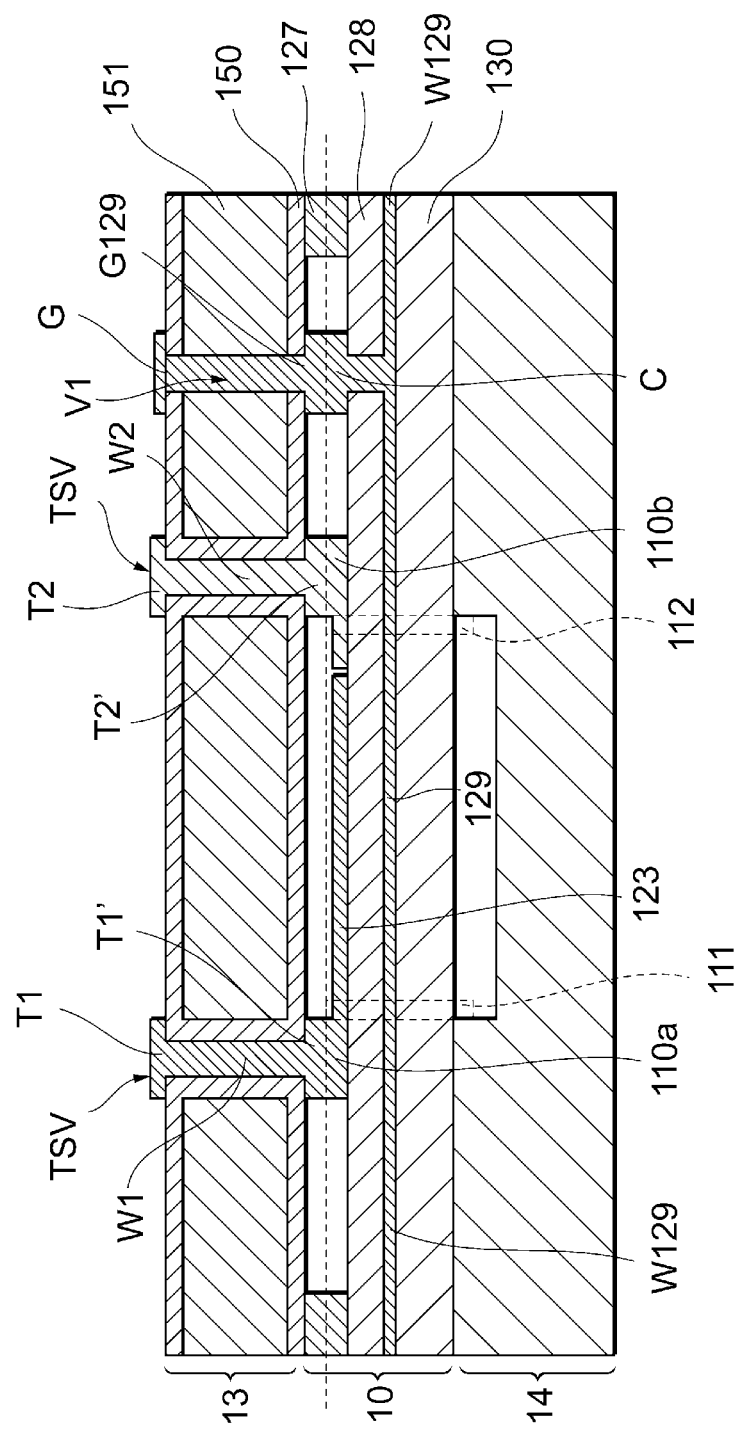
FIG. 6 schematically illustrates an example structure in a cross section of a resonator device according to a second embodiment.

FIG. 6 schematically illustrates an example structure in a cross section of a resonator device 1 according to this embodiment. The points different from the first embodiment are mainly described below in the specific configuration of the resonator device 1 according to this embodiment.

(1. Lower Lid 14)

The configuration of the lower lid 14 is similar to that according to the first embodiment.

(2. Resonator 10)

The configuration of the resonator 10 is similar to that according to the first embodiment.

(3. Junction Portion 127)

The configuration of the junction portion 127 is similar to that according to the first embodiment.

(4. Upper Lid 13)

In this embodiment, the upper lid 13 has a via V1 (an example of a second through hole) in addition to the two through holes TSV. The via V1 is formed to penetrate through the insulating film 150 on the front surface of the upper lid 13, the Si layer 151, and the insulating film 150 on the rear surface. Further, the insulating film 150 is not formed on the surface in the via V1, and the Si layer 151 is exposed. The ground wire G129 is provided in the via V1 provided in the upper lid 13. The ground terminal G is connected to the conductive layer C by the ground wire G129. Accordingly, reliability of conduction between the lower electrode 129 and the ground terminal G can be improved. The other configuration of the upper lid 13 is similar to that according to the first embodiment. The other configuration and effect of the resonator device 1 are similar to those according to the first embodiment.

Third Embodiment

Figure 7:
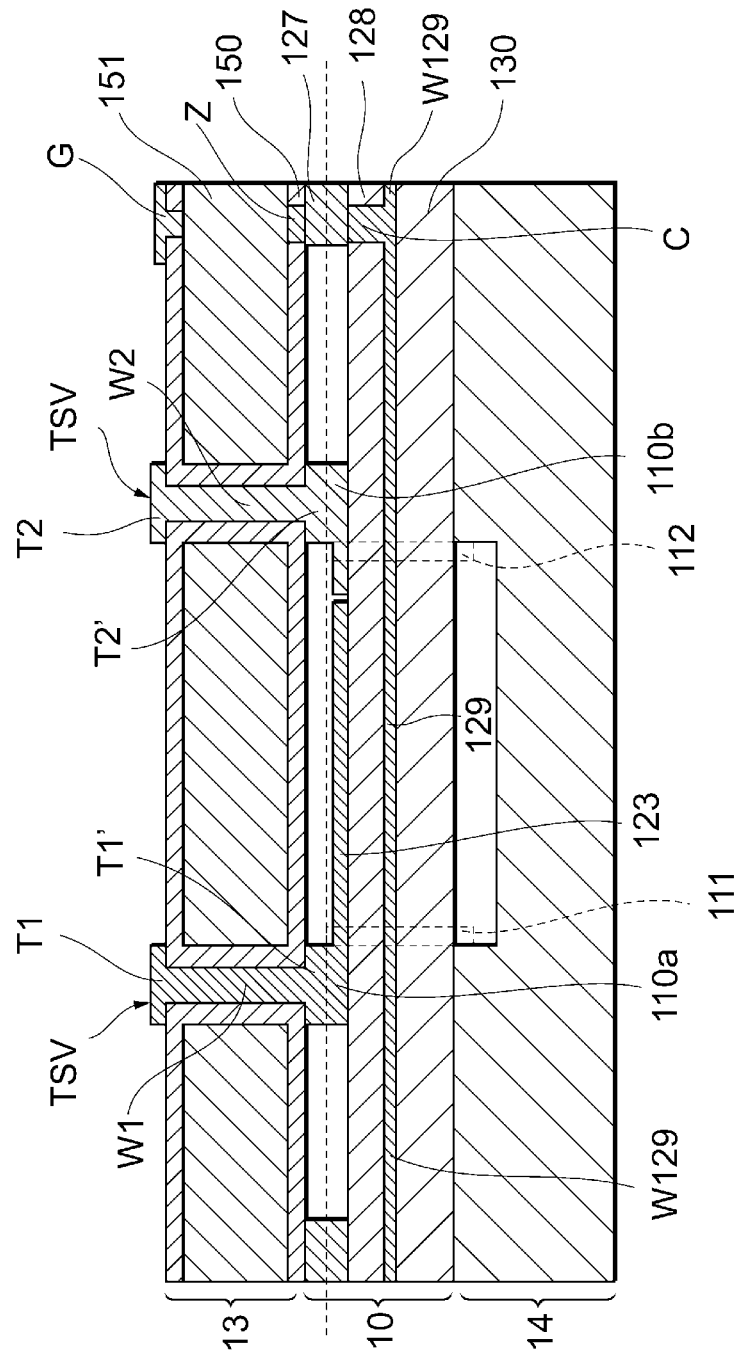
FIG. 7 schematically illustrates an example structure in a cross section of a resonator device according to a third embodiment.

FIG. 7 schematically illustrates an example structure in a cross section of a resonator 10 according to this embodiment. The points different from the first embodiment are described below from among components of the resonator 10 according to this embodiment.

(1. Lower Lid 14)

The configuration of the lower lid 14 is similar to that according to the first embodiment.

(2. Resonator 10)

In this embodiment, a portion of the piezoelectric thin film 128 of the holder 11 formed at the junction position between the holder 11 and the junction portion 127 are removed by processing such as etching. The portion from which the piezoelectric thin film 128 is removed is filled with metal that forms the lower wire W129, for example, molybdenum or aluminum. In this embodiment, the portion filled with the metal corresponds to the conductive layer C according to the first embodiment. The other configuration of the resonator 10 is similar to that according to the first embodiment.

(3. Junction Portion 127)

The configuration of the junction portion 127 is similar to that according to the first embodiment.

(4. Upper Lid 13)

In this embodiment, the insulating film 150 is removed from a portion of the rear surface in the upper lid 13, and the Si layer 151 is exposed. A film Z is formed on the exposed front surface of the Si layer 151. The film Z is made of an electrically conductive material, such as metal, for example, molybdenum or aluminum. The upper lid 13 is connected to the junction portion 127 by the film Z.

Accordingly, the ground terminal G is electrically connected to the film Z via the Si layer 151 of the upper lid 13. Also, the film Z is electrically connected to the conductive layer C via the junction portion 127. Hence, the ground terminal G is electrically connected to the lower electrode 129 via the upper lid 13 and the junction portion 127.

In this way, according to this embodiment, since the lower electrode 129 can be grounded by using the junction portion 127, it is no longer required to provide the ground wire G129 inside the upper lid 13, and the product size can be decreased. Further, in this embodiment, the junction portion 127 is grounded via the upper lid 13. Accordingly, the periphery of the vibrating portion 120 is surrounded by the grounded junction portion 127, and hence the influence of disturbance due to a wire and static electricity can be reduced. The other configuration of the upper lid is similar to that according to the first embodiment. Moreover, the other configuration and effect of the resonator device 1 are similar to those according to the first embodiment.

Fourth Embodiment

Figure 8:
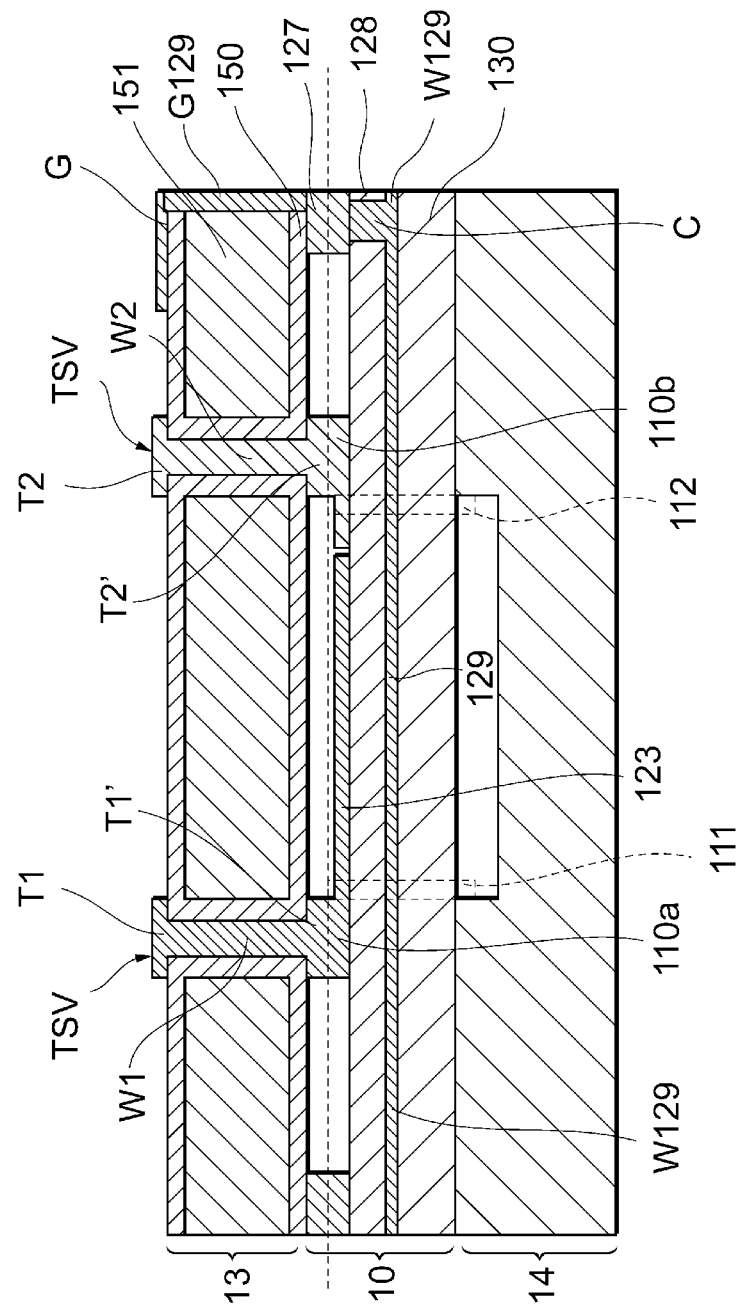
FIG. 8 schematically illustrates an example structure in a cross section of a resonator device according to a fourth embodiment.

FIG. 8 schematically illustrates an example structure in a cross section of a resonator 10 according to this embodiment. The points different from the first embodiment are described below from among components of the resonator 10 according to this embodiment.

(1. Resonator 10)

In this embodiment, a portion of the piezoelectric thin film 128 of the holder 11 formed at the junction position between the holder 11 and the junction portion 127 is removed by processing such as etching. The portion from which the piezoelectric thin film 128 is removed is filled with metal that forms the lower wire W129, for example, molybdenum or aluminum. In this embodiment, the portion filled with the metal corresponds to the conductive layer C according to the first embodiment. The other configuration of the resonator 10 is similar to that according to the first embodiment.

(2. Upper Lid 13)

In this embodiment, the ground wire G129 is formed to extend from the ground terminal G to the junction position between the junction portion 127 and the upper lid 13 along a side of the upper lid 13. To be specific, the ground wire G129 is provided on the insulating film 150 formed on the surface of the upper lid 13. The ground terminal G is connected to the junction portion 127 by the ground wire G129. Also, the ground wire G129 is electrically connected to the conductive layer C via the junction portion 127.

According to this embodiment, the ground wire G129 is provided on the surface of the upper lid 13, and the lower electrode 129 can be grounded by using the junction portion 127. Accordingly, it is no longer required to provide the ground wire G129 in the upper lid 13. As a result, the product size can be decreased. The other configuration of the upper lid is similar to that according to the first embodiment. The other configuration and effect of the resonator device 1 are similar to those according to the first embodiment.

Fifth Embodiment

Figure 9:
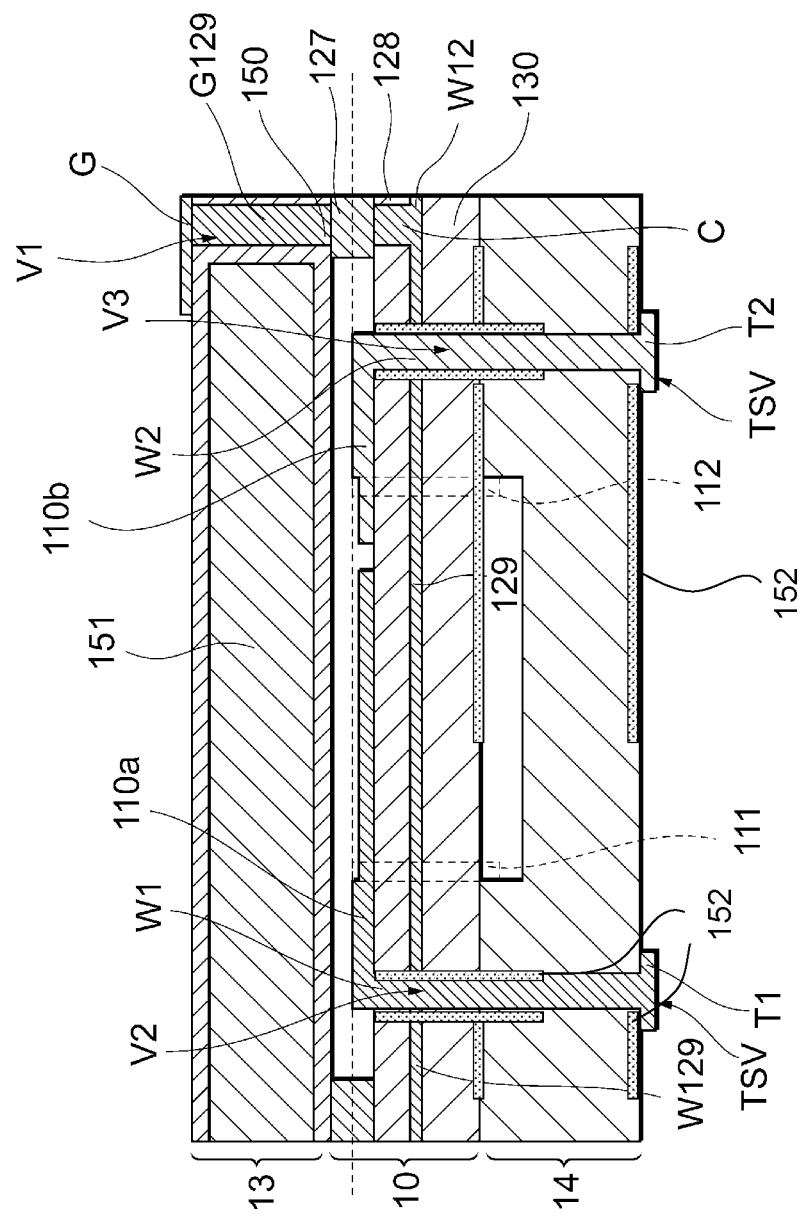
FIG. 9 schematically illustrates an example structure in a cross section of a resonator device according to a fifth embodiment.

FIG. 9 schematically illustrates an example structure in a cross section of a resonator 10 according to this embodiment. The points different from the first embodiment are described below from among components of the resonator 10 according to this embodiment.

(1. Lower Lid 14)

In this embodiment, a lower lid 14 has terminals T1 and T2, wires W1 and W2, and two through holes TSV. Also, an insulating film 152 is formed on the rear surface of the lower lid 14 (an example of a second surface of a lower lid), as well as on the inner sides of the through holes TSV. Hence, the wires W1 and W2 are electrically insulated from the through holes TSV. The other configuration of the lower lid 14 is similar to that according to the first embodiment.

(2. Resonator 10)

In this embodiment, a portion of the piezoelectric thin film 128 of the holder 11 formed at the junction position between the holder 11 and the junction portion 127 is removed by processing such as etching. The portion from which the piezoelectric thin film 128 is removed is filled with metal that forms the lower wire W129, for example, molybdenum or aluminum. In this embodiment, the portion filled with the metal corresponds to the conductive layer C according to the first embodiment.

Also, the holder 11 has through holes V2 and V3. In this aspect, the through holes V2 and V3 are formed to penetrate through the Si substrate 130, the lower wire W129, and the piezoelectric thin film 128. The flow of forming the through holes V2 and V3 is described. A through hole is formed in the Si substrate 130 first, and then the insulating film 150 is formed on the inner side of the through hole. Then, when the lower wire W129 is stacked on the holder 11, the through hole formed in the Si substrate 130 is filled with the metal forming the lower wire W129. The filled metal is removed from the through hole by processing such as etching. Then, when the piezoelectric thin film 128 is stacked on the holder 11, the through hole from which the metal is removed is filled with the piezoelectric thin film 128. Further, the filled piezoelectric thin film 128 is removed by processing such as etching so that the piezoelectric thin film 128 remains on a portion that covers the surface of the inner side. Thus the through holes V2 and V3 are formed.

On the other hand, the wires W1 and W2 are formed, when the upper wires W111 and W112 are stacked on the holder 11, by filling the inside of the through holes V2 and V3 with the metal forming the upper wires W111 and W112. The wires W1 and W2 in the through holes V2 and V3 are connected to the wires W1 and W2 formed in the lower lid 14 when the lower lid 14 is joined to the resonator 10. The other configuration of the resonator 10 is similar to that according to the first embodiment.

(3. Upper Lid 13)

In this embodiment, the upper lid 13 does not have the terminals T1 and T2, the wires W1 and W2, and the two through holes TSV, but has the via V1. The via V1 is provided on or above the junction position between the upper lid 13 and the junction portion 127. The via V1 is formed to penetrate through the insulating film 150 on the front surface of the upper lid 13, the Si layer 151, and the insulating film 150 on the rear surface. Further, the insulating film 150 is not formed on the surface in the via V1, and the Si layer 151 is exposed. The ground wire G129 is provided in the via V1 provided in the upper lid 13. The ground terminal G is connected to the junction portion 127 by the ground wire G129. Also, the ground wire G129 is electrically connected to the conductive layer C via the junction portion 127.

In this way, according to this embodiment, since the lower electrode 129 can be grounded by using the junction portion 127, it is no longer required to provide the ground wire G129 inside the upper lid 13, and the product size can be decreased. The other configuration of the upper lid is similar to that according to the first embodiment. The other configuration and effect of the resonator device 1 are similar to those according to the first embodiment.

Sixth Embodiment

FIGS. 10 to 14 schematically illustrate an example structure of a resonator 10 according to this embodiment. The points different from the first embodiment are described below from among components of the resonator 10 according to this embodiment.

Figure 13:
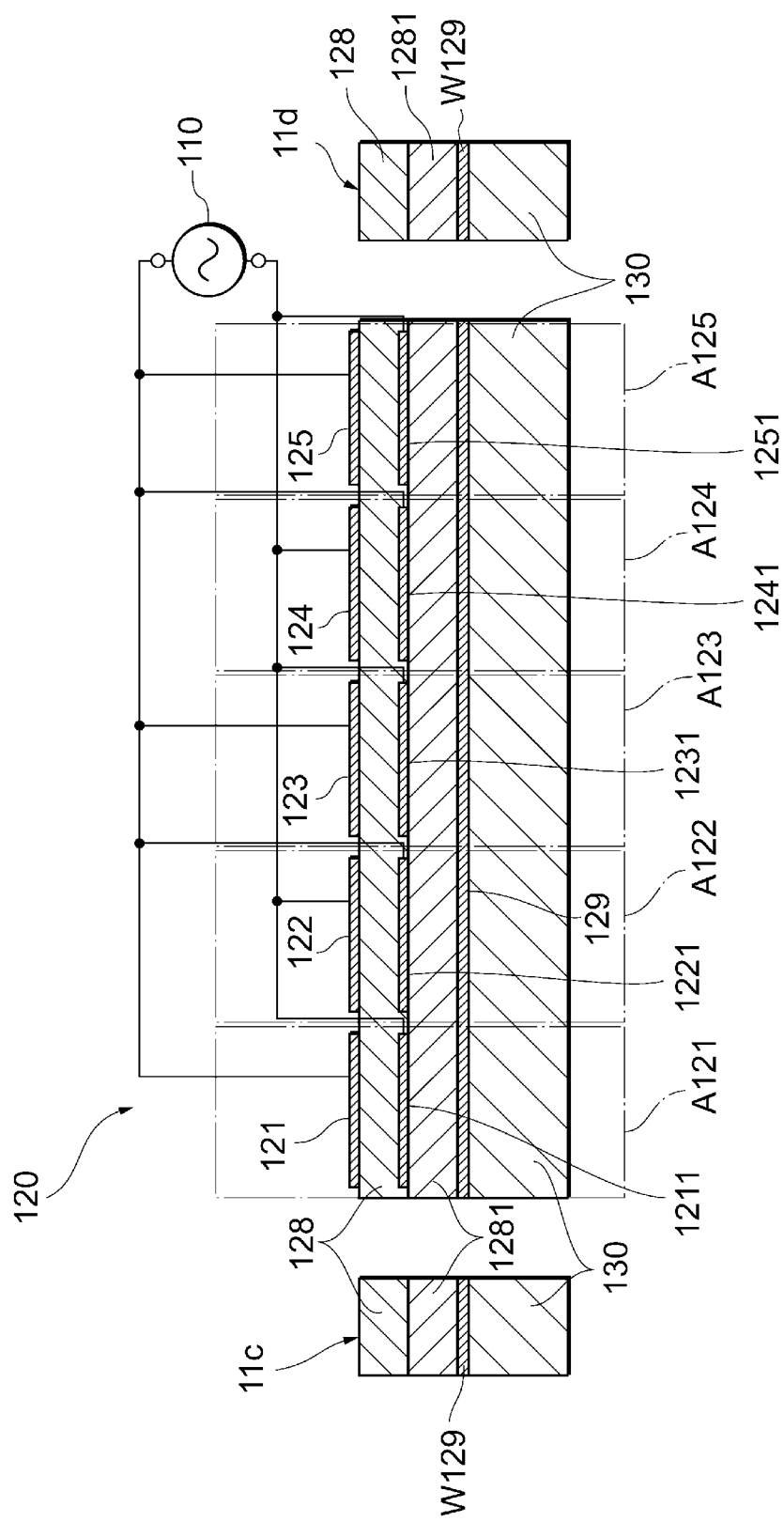
FIG. 13 schematically illustrates an example structure in a cross section of the resonator according to the sixth embodiment.

In this embodiment, the resonator 10 includes two layers of piezoelectric thin films 128 and 1281 (see FIG. 13), and two layers of upper electrodes 121 to 125 and 1211 to 1251 (see FIG. 13). The numbers of layers of the piezoelectric thin films and the upper electrodes each are not limited to two, and may have multilayer structures each including two or more layers.

In the following description, the layer including the piezoelectric thin film 128 and the upper electrodes 121 to 125 is called first layer, the layer including the piezoelectric thin film 1281 and the upper electrodes 1211 to 1251 is called second layer, and the layer including a lower electrode 129 is called lower electrode layer, in the Z-axis direction of the resonator 10.

(1. First Layer)

Figure 10:
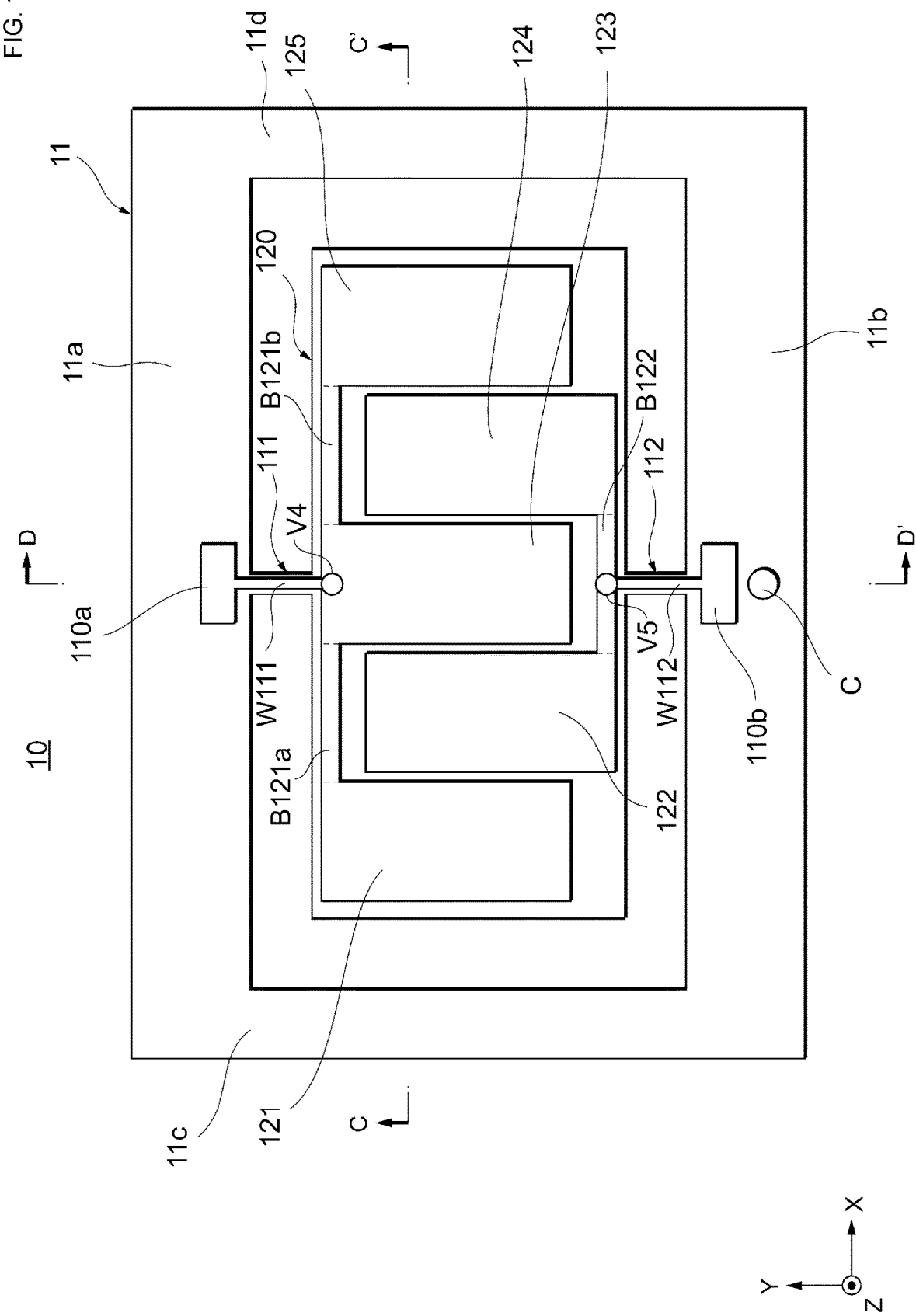
FIG. 10 schematically illustrates an example plan structure of a first layer of a resonator according to a sixth embodiment.

FIG. 10 is a plan view of the first layer of the resonator 10 according to this embodiment. A vibrating portion 120 according to this embodiment has vias V4 and V5 in the first layer, in addition to the configuration described in the first embodiment with reference to FIG. 4. The via V4 is formed to penetrate through the upper electrode 123 and the piezoelectric thin film 128 at a position around the connection position between the upper electrode 123 and the upper wire W111. The via V5 is formed to penetrate through the busbar B122 and the piezoelectric thin film 128 around the center of the busbar B122. In this aspect, the vias V4 and V5 are filled with an electrically conductive material, such as molybdenum or aluminum. The other configuration of the first layer is similar to the plan structure according to the first embodiment.

(2. Second Layer)

Figure 11:
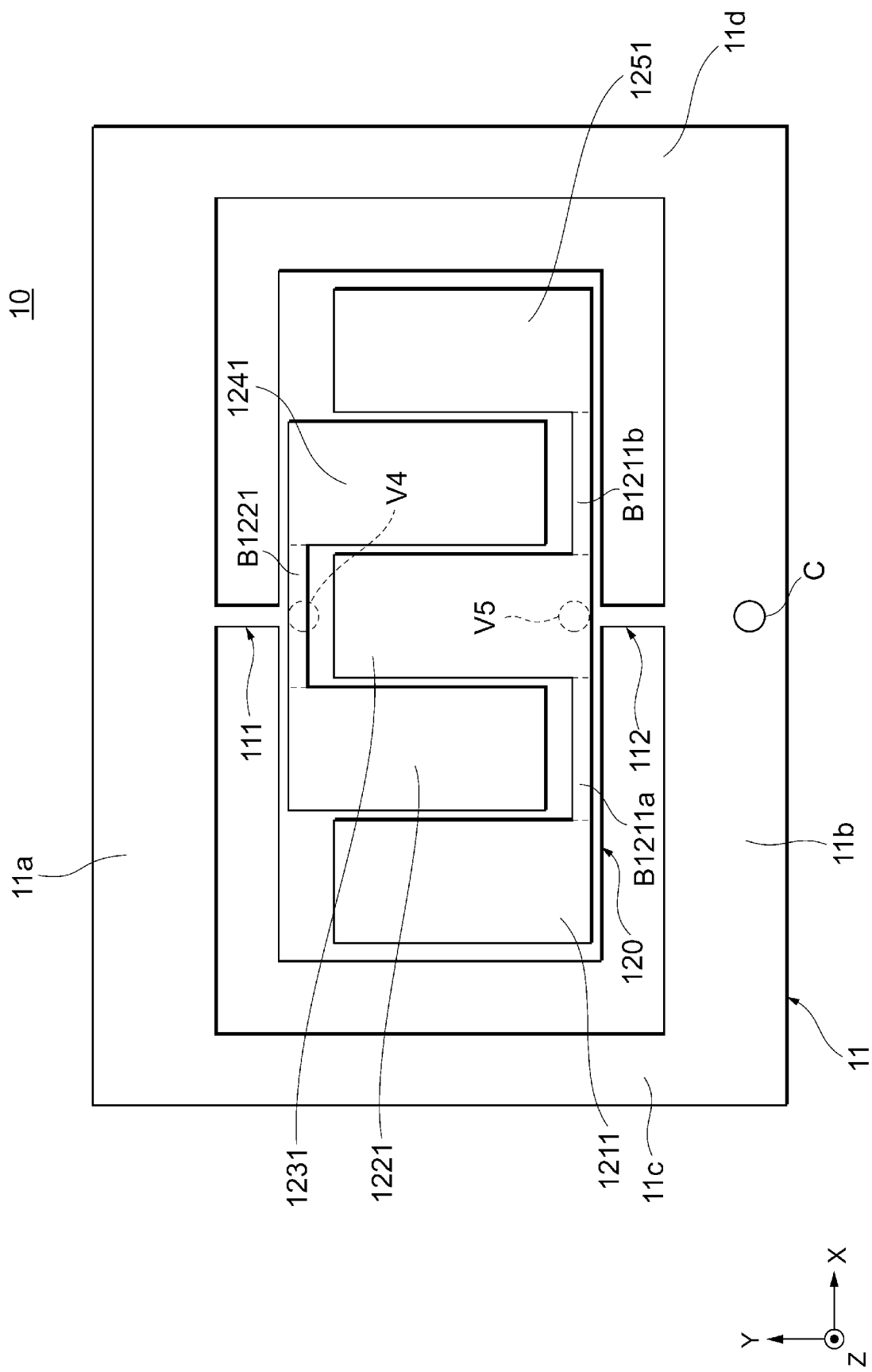
FIG. 11 schematically illustrates an example plan structure of a second layer of the resonator according to the sixth embodiment.

FIG. 11 is an example plan view of the second layer of the resonator 10 according to this embodiment. The vibrating portion 120 according to this embodiment has the upper electrodes 1211 to 1251 and busbars B1211a, B1211b, and B1221 in the second layer.

According to the exemplary aspect, the upper electrodes 1211 to 1251 are formed at positions respectively corresponding to the upper electrodes 121 to 125 in the first layer.

Lower ends (on the frame body 11b side) of the upper electrodes 1211 and 1231 are connected to the busbar B1211a. Lower ends (on the frame body 11b side) of the upper electrodes 1231 and 1251 are connected to the busbar B1211b. Upper ends (on the frame body 11a side) of the upper electrodes 1221 and 1241 are connected to the busbar B1221.

Further, the via V4 formed in the first layer is located around the center of the busbar B1221 for the second layer. Further, the via V5 formed in the first layer is located around the center of the lower end (on the frame body 11b side) of the upper electrode 1231 for the second layer.

A conductive layer C is formed in the frame body 11b in the second layer.

In this way, the vibrating portion 120 in the second layer has a structure that is inverted upside down in the Y-axis direction of the vibrating portion 120 in the first layer.

(3. Lower Electrode Layer)

Figure 12:
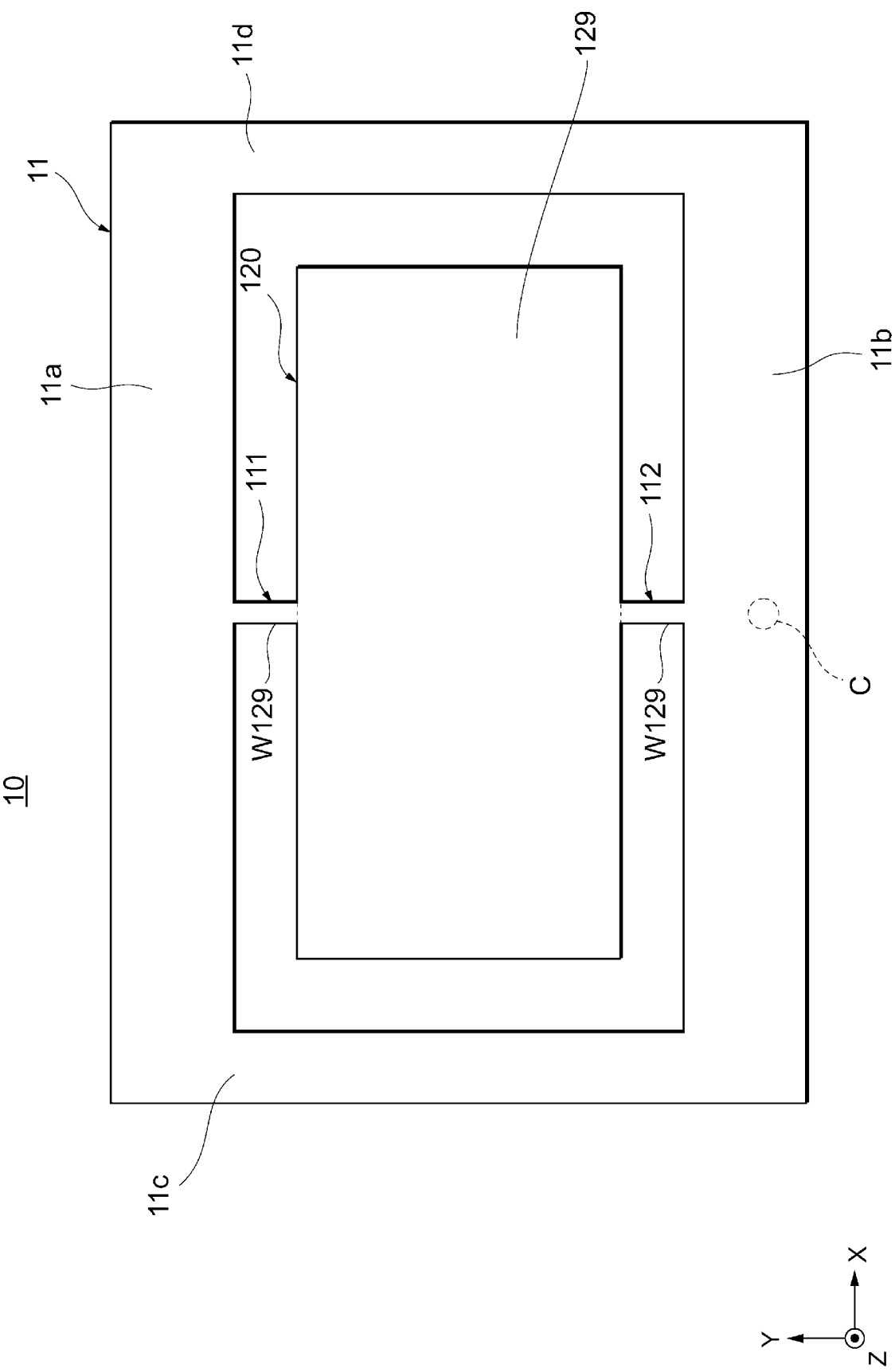
FIG. 12 schematically illustrates an example plan structure of a lower electrode layer of the resonator according to the sixth embodiment.

FIG. 12 is an example plan view of the lower electrode layer of the resonator 10 according to this embodiment. In the lower electrode layer, the lower electrode 129 is formed on the entire surface of the vibrating portion 120 according to this embodiment. The lower electrode 129 formed on the vibrating portion 120 is extended to the holding arms 111 and 112 by the lower wire W129, and is spread on the entire surface of the holder 11.

Further, the conductive layer C formed in the first and second layers is located around the center of the frame body 11b for the lower electrode layer.

(4. Cross-Sectional Configuration)

FIG. 13 is a cross-sectional view taken along line C-C' in FIG. 10. As illustrated in FIG. 13, the piezoelectric thin film 1281 is stacked to cover the lower electrode 129 and the lower wire W129. Further, the upper electrodes 1211 to 1251 are stacked on the piezoelectric thin film 1281. The single-layer form of the upper electrodes 1211 to 1251 is formed on the vibrating portion 120, and then is divided into five by processing such as etching.

The piezoelectric thin film 128 is stacked on the upper electrodes 1211 to 1251, and the upper electrodes 121 to 125 are formed on the piezoelectric thin film 128.

The components and film thicknesses of the piezoelectric thin film 1281 and the upper electrodes 1211 to 1251 are similar to those of the piezoelectric thin film 128 and the upper electrodes 121 to 125 described in the first embodiment. Also, the method of manufacturing the piezoelectric thin films 128 and 1281, and the upper electrodes 121 to 125, and 1211 to 1251 according to this embodiment are similar to that of the piezoelectric thin film 128 and the upper electrodes 121 to 125 according to the first embodiment.

FIG. 14 is a cross-sectional view taken along line D-D' in FIG. 10. As illustrated in FIG. 14, the busbar B1221 in the second layer is extended to the first layer by using the via V4, and is connected to the voltage applying portion 110a by using the upper wire W111. The busbar B1221 is connected to the upper electrodes 1221 and 1241 as described above (see FIG. 11). Hence, the upper electrodes 1221 and 1241 are connected to the voltage applying portion 110a by using the via V4.

On the other hand, the upper electrode 1231 in the second layer is extended to the first layer by using the via V5, and is connected to the voltage applying portion 110b by using the upper wire W112. The upper electrode 1231 is connected to the upper electrodes 1211 and 1251 by using the busbars B1211a and B1211b as described above (see FIG. 11). Hence, the upper electrodes 1211 and 1251 are connected to the voltage applying portion 110b by using the via V5.

As illustrated in FIGS. 13 and 14, in the resonator 10 according to this embodiment, alternating electric fields with opposite phases are applied to the upper electrodes 121 to 125 and the upper electrodes 1211 to 1251 formed at mutually opposite positions in the first and second layers. That is, an alternating electric field with the same phase is applied to the upper electrodes 121, 123, 125, 1221, and 1241. Also, an alternating electric field with the counter phase is applied to the upper electrodes 122, 124, 1211, 1231, and 1251, the phase of which is opposite to that of the alternating electric field to the upper electrodes 121, 123, 125, 1221, and 1241.

In the resonator 10 according to this embodiment, since the piezoelectric thin films and the upper electrodes have multilayer structures as described above, the electrostatic capacity can be increased, and the influence of the stray capacitance can be reduced.

The above-described embodiments are provided for easier understanding of the present disclosure and are not for interpreting the exemplary embodiments in a limited manner. The exemplary embodiments of the present invention may be modified and improved without departing from the idea, and the present invention includes the equivalents. That is, the present invention includes, within its scope, a configuration obtained by those skilled in the art properly adding a change in design to any of the aforementioned embodiments as long as the resultant has the characteristics of the present invention. For example, respective elements, their arrangement, materials, conditions, shapes, sizes, and so forth in any of the aforementioned embodiments are not limited to those exemplified, and may be properly changed. The embodiments are merely examples, and the respective elements included in different ones of the aforementioned embodiments may be combined as far as technically possible. The present invention includes the combination as long as the combination has the characteristics of the present invention.

REFERENCE SIGNS LIST 1 resonator device
10 resonator
13 upper lid
14 lower lid
11 holder
11a to 11d frame body
110a and 110b voltage applying portion
111 holding arm
120 vibrating portion
121 to 125 upper electrode
128 piezoelectric thin film
129 lower electrode
130 Si substrate
127 junction portion
150 insulating film
151 Si layer
TSV through hole
V1, V2, and V3 via
G ground terminal
T1 and T2 terminal
G129 ground wire
W1 and W2 wire

The invention claimed is:

1. A resonator device, comprising:
a resonator including a lower electrode, a plurality of upper electrodes, and a piezoelectric film disposed between the lower electrode and the plurality of upper electrodes;
an upper lid having a first and second opposing surfaces with the first surface facing the plurality of upper electrodes of the resonator to seal an upper surface of the resonator;
a lower lid having a first and second opposing surfaces with the first surface facing the lower electrode of the resonator to seal a lower surface of the resonator;
at least one power terminal electrically connected to at least one of the plurality of upper electrodes; and
a ground terminal disposed on the second surface of the upper lid and electrically connected to the lower electrode via the upper lid,
wherein the upper lid comprises a semiconductor layer with an insulating layer disposed on the first and second opposing surfaces, and
wherein the ground terminal is disposed on the second surface of the upper lid at a position where the insulating layer is removed so that the ground terminal is directly connected to the semiconductor layer.

2. The resonator device according to claim 1, further comprising:
at least one first through hole extending through the upper lid;
a wire that connects the at least one power terminal with the at least one of the plurality of upper electrodes via the at least one first through hole, respectively; and
an insulating layer interposed between the upper lid and the at least one first through hole.

3. The resonator device according to claim 2, wherein the upper lid is electrically connected to the ground terminal and the lower electrode, and wherein a capacitance is formed between the upper lid and the at least one power terminal with the insulating layer interposed therebetween.

4. The resonator device according to claim 1, further comprising a junction layer disposed between the upper lid and the resonator that electrically connects the ground terminal to the lower electrode.

5. The resonator device according to claim 4, wherein the piezoelectric film of the resonator comprises a via with a conductive layer disposed in the via to electrically connect the junction layer to the lower electrode.

6. The resonator device according to claim 1, further comprising:
a through hole extending through the upper lid; and
a wire disposed in the through hole to electrically connect the lower electrode to the ground terminal via the through hole.

7. The resonator device according to claim 6, further comprising a junction layer disposed between the upper lid and the resonator that electrically connects the ground terminal to the lower electrode, wherein the piezoelectric film of the resonator comprises a via with a conductive layer disposed in the via of the piezoelectric film to electrically connect the junction layer to the lower electrode.

8. The resonator device according to claim 1, wherein the plurality of upper electrodes comprises three upper electrodes electrically connected to each other and extending in a first direction and two upper electrodes electrically connected to each other and extending in a second direction opposite to the first direction and interposed, respectively, between the three upper electrodes.

9. The resonator device according to claim 8, wherein the at least one power terminal comprises a first power terminal electrically connected to the three upper electrodes and a second power terminal connected to the two upper electrodes, such that neighboring upper electrodes vibrate in opposite phase when an alternating electric field is applied in a c-axis direction of the piezoelectric film.

10. A resonator device comprising:
a resonator including a lower electrode, a plurality of upper electrodes, and a piezoelectric film disposed between the lower electrode and the plurality of upper electrodes;
an upper lid having a first and second opposing surfaces with the first surface facing the plurality of upper electrodes of the resonator to seal an upper surface of the resonator;
a lower lid having a first and second opposing surfaces with the first surface facing the lower electrode of the resonator to seal a lower surface of the resonator;
at least one power terminal electrically connected to at least one of the plurality of upper electrodes; and
a ground terminal disposed on the second surface of the upper lid and electrically connected to the lower electrode via the upper lid,
wherein the upper lid comprises a semiconductor layer with an insulating layer disposed on the first and second opposing surfaces, and
wherein the semiconductor layer comprises degenerate silicon.

11. A resonator device, comprising:
a resonator including a piezoelectric film, a lower electrode disposed on a first surface of the piezoelectric film, a plurality of upper electrodes disposed on a second surface of the piezoelectric film, the plurality of upper electrodes including at least one first upper electrode and at least one second upper electrode electrically isolated from each other;

an upper lid having inner and outer opposing surfaces with the inner surface facing the plurality of upper electrodes of the resonator to seal the resonator;

a lower lid having inner and outer opposing surfaces with the inner surface facing the lower electrode of the resonator to seal the resonator;

a pair of power terminals disposed on the outer surface of the upper lid and respectively coupled to the at least one first and at least one second upper electrodes by respective through holes extending through the upper lid; and a ground terminal disposed on the outer surface of the upper lid and electrically connected to the lower electrode via the upper lid, wherein the upper lid comprises a semiconductor layer with an insulating layer disposed on the inner and outer opposing surfaces, and wherein the ground terminal is disposed on the outer surface of the upper lid at a position where the insulating layer is removed so that the ground terminal is directly connected to the semiconductor layer.

12. The resonator device according to claim 11, wherein the upper lid is electrically connected to the ground terminal and the lower electrode, and wherein a capacitance is formed between the upper lid and at least one of the pair of power terminals with the insulating layer interposed therebetween.

13. The resonator device according to claim 11, wherein the semiconductor layer comprises degenerate silicon.

14. The resonator device according to claim 13, further comprising a junction layer disposed between the upper lid and the resonator that electrically connects the ground terminal to the lower electrode.

* * * * *